United States Patent [19]
Gibb

[11] Patent Number: 5,287,086
[45] Date of Patent: Feb. 15, 1994

[54] PROXIMITY DETECTION SYSTEM AND OSCILLATOR

[75] Inventor: Robert F. Gibb, San Diego, Calif.

[73] Assignee: Raptor, Inc., San Diego, Calif.

[21] Appl. No.: 763,990

[22] Filed: Sep. 23, 1991

Related U.S. Application Data

[63] Continuation-in-part of Ser. No. 459,546, Jan. 2, 1990, abandoned.

[51] Int. Cl.[5] .............................................. G08B 21/00
[52] U.S. Cl. ..................................... 340/618; 340/612;
73/304 C; 73/304 R; 324/660; 324/674;
331/64; 331/65
[58] Field of Search ....................... 340/618, 620, 612;
73/304 C, 304 R, 290 R, 302; 331/64, 65;
324/660, 674, 681

[56] References Cited

U.S. PATENT DOCUMENTS

| | | | |
|---|---|---|---|
| 3,646,541 | 2/1972 | Rathbun | 331/65 X |
| 4,347,740 | 9/1982 | Townsend | 331/65 X |
| 4,530,372 | 7/1985 | Overton | 73/304 C X |

Primary Examiner—Jeffrey Hofsass
Attorney, Agent, or Firm—William Patrick Waters

[57] ABSTRACT

A proximity detection system includes a dual mode oscillator for generating a pair of ON and OFF control signals. A sensing circuit including a capacitance device detects the presence of a conductive object, such as a liquid, to cause the oscillator to switch its modes of oscillation.

12 Claims, 3 Drawing Sheets

"PROXIMITY DETECTION SYSTEM AND OSCILLATOR"

CROSS-REFERENCE TO RELATED APPLICATIONS

This present application is a continuation-in-part of U.S. patent application Ser. No. 07/459,546 filed Jan. 2, 1990, entitled "VARIABLE IMPEDANCE SENSOR" which is incorporated herein by reference.

TECHNICAL FIELD

The present invention relates in general to a proximity detection system and an oscillator, as well as a method of using them. It more particularly relates to such a liquid level sensing system, which can detect a rise in a liquid level, or which can detect the presence or absence of other conductive surfaces.

BACKGROUND ART

There have been many different types and kinds of proximity detectors. They have usually employed electrical switches which are actuated when a conductor, such as a body of water, moves into close proximity to a sensor.

For example, the following are U.S. patents disclosing several such detectors and systems: U.S. Pat. Nos. 3,588,859; 3,665,300; 4,800,755; 4,875,497 and U.S. Pat. No. 5,017,909. For example, in the U.S. Pat. No. 5,017,909, there is disclosed a proximity detector used as a liquid level detector. Such a detector is used to detect liquid level receptacles employed with vehicles.

Other applications for liquid level detectors include pumping systems, such as a bilge pumping system for ships. Such a pumping system must be activated before the accumulated water reaches an unsafe level. In this regard, detection of an unsafe water level is usually accomplished by mechanical floatation systems, which cause a switch to be actuated whenever the water reaches such an undesired level.

Prior known liquid level detection systems have generally proven to be less than satisfactory for some applications, because they have included a number of parts which are subject to mechanical failure, as well as corrosion due to exposure to moisture.

Therefore, it would be highly desirable to have a new and improved proximity detection system which is highly reliable and relatively inexpensive to manufacture. Such a proximity detection system should be highly sensitive and possess a wide range of applications.

DISCLOSURE OF INVENTION

Therefore, the principal object of the present invention is to provide a new and improved proximity detection system which is highly accurate and sensitive in its operation and which is relatively inexpensive to manufacture.

Another object of the present invention is to provide such a new and improved proximity detection system, which, when employed as a liquid level detector, is protected against unwanted corrosion due to exposure to moisture.

A further object of the present invention is to provide such a new and improved proximity detection system which can be adapted for a wide variety of applications.

Briefly, the above and further objects are realized in accordance with the present invention by providing a new and improved proximity detection system, which is highly sensitive and reliable, and which possesses a wide variety of applications.

A proximity detection system, and method of using it, includes a dual mode oscillator for generating a pair of ON and OFF control signals. A sensing circuit including a capacitance device detects the presence of a conductive object, such as a liquid, to cause the oscillator to switch its modes of oscillation.

The dual mode oscillator and sensing circuit are encapsulated sealably within a corrosion resistant electrically nonconductive material to help prevent the oscillator and sensing circuit from becoming damaged by moisture when the system is employed as a liquid level detector. With this arrangement, the entire system is highly resistant to corrosion, includes no movable parts, and may be quickly and easily mounted in an operating position.

The inventive dual mode oscillator operates at two different duty cycles to provide the two different control signals. Such new and improved oscillator has a wide variety of applications, since it is relatively inexpensive to manufacture, and is highly sensitive and responsive.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein.

BEST MODE FOR CARRYING OUT THE INVENTION

Figure 1:
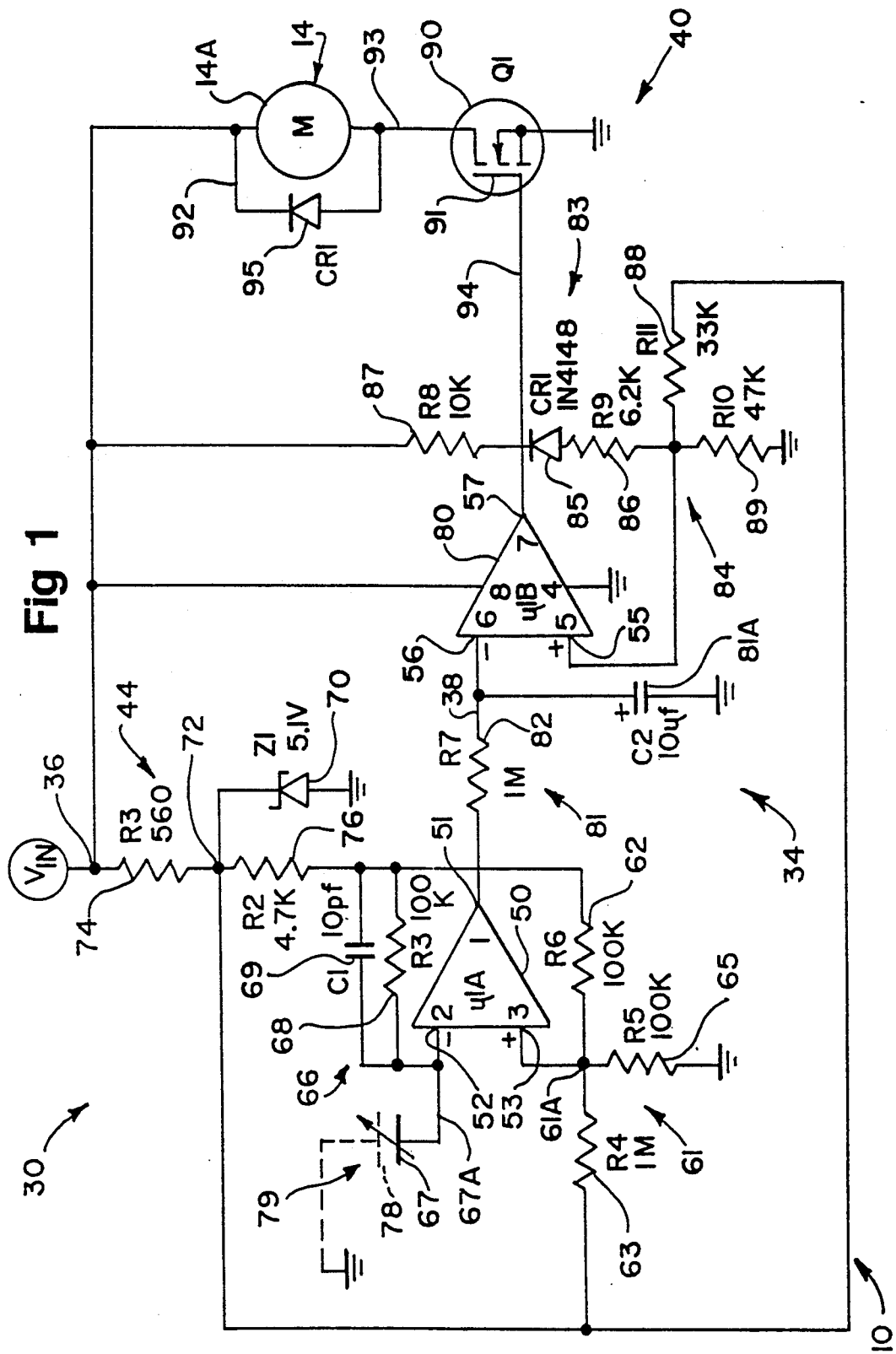
FIG. 1 is a schematic circuit diagram of a proximity detector system, and its dual mode oscillator, which are constructed in accordance with the present invention, and which are illustrated coupled to a pump motor to serve as a liquid level detection system.
Figure 2:
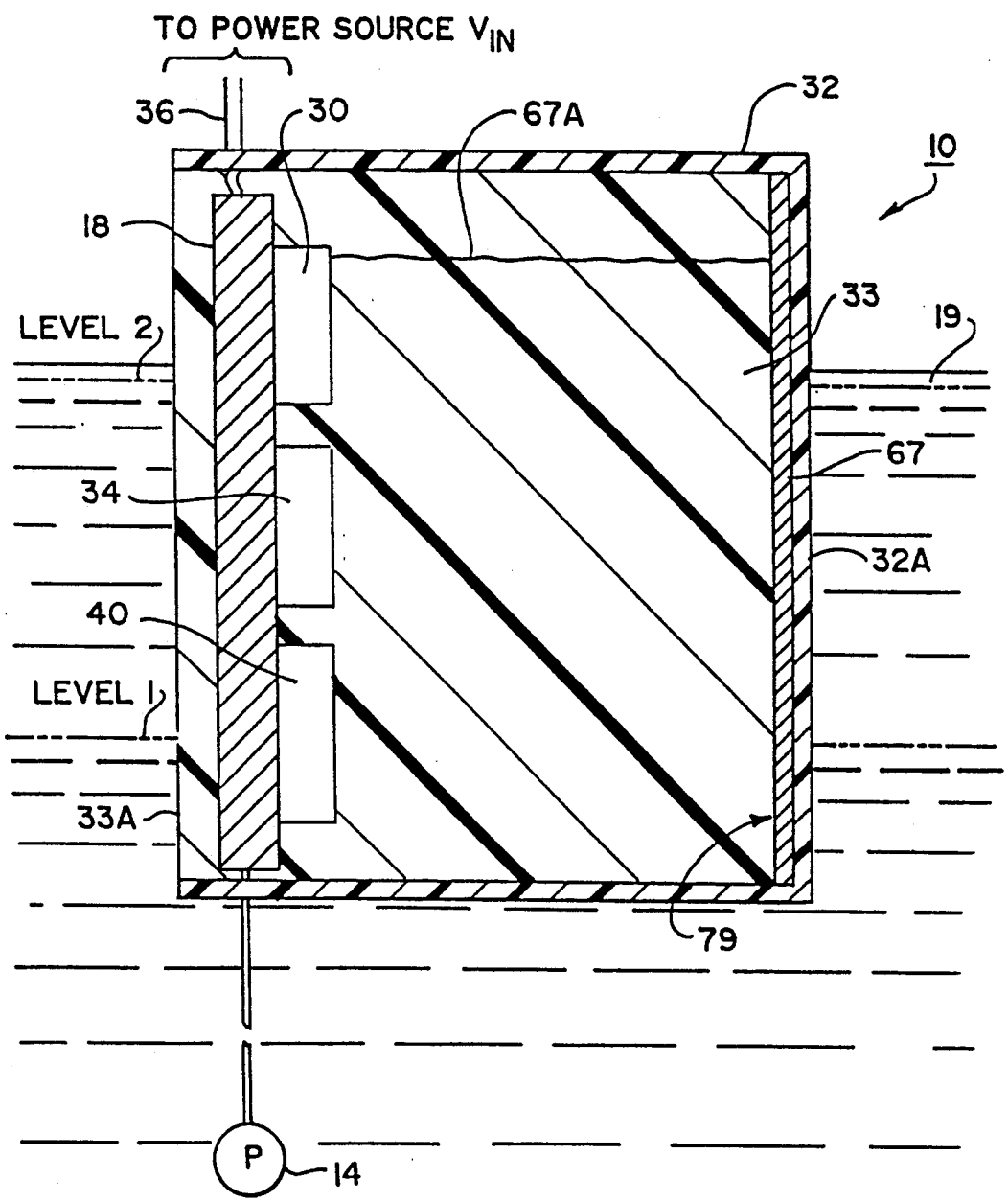
FIG. 2 is a sectional diagrammatic view of the proximity detection system of FIG. 1.

Referring now to the drawings and more particularly to FIGS. 1 and 2, there is shown a proximity detection system 10, which is constructed in accordance with the present invention, and which is connected drivingly to a submersible pump 14 disposed in the bilge (not shown) of a ship (not shown). While the system 10 is shown and described to be a liquid level detection system for a bilge of a ship, it will become apparent to those skilled in the art that the system 10 may also be employed with other different types and kinds of applications, and when used as a liquid level detection system, it can be used to monitor a variety of different liquid containing vessels or containers, such as a liquid reservoir of vehicles.

In a preferred form of the invention, the system 10 of the present invention enables the depth of water within the bilge or hold of a ship to be monitored continuously in a highly accurate manner for activating the submersible pump 14 to discharge an unwanted accumulation of bilge water. In this regard, a D.C. power source $V_{in}$ (FIG. 1) electrically energizes the system 10, which couples the output of the source $V_{in}$ to the pump 14 when the system 10 detects an undesired rise in water level to a level, such as a level 2, as indicated in FIG. 1.

As best seen in FIG. 2, the pump 14 is mounted at a sufficient distance below the system 10 to discharge an undesirable accumulation of water 19 from the bilge. The system 10 is mounted in the ship, slightly immersed in the body of water 19 disposed normally at or about a safe Water line indicated generally at level 1 (FIG. 2). When the water 19 rises from the initial height, indicated generally at level 1, to a sufficient height indicated generally at level 2, the system 10 detects the rise in the water level, and thereby causes an ON control signal to be generated for activating the pump 14. As a result, water is discharged from the bilge until the water recedes to the normal level 1.

As shown in FIGS. 1 and 2, the proximity detection system 10 generally comprises a sealed housing 32 having encapsulated therein a dual oscillating mode oscillator 30, which changes its duty cycle of oscillation. A capacitance sensing circuit generally indicated at 79 changes capacitance when the water level rises, to, in turn, cause the oscillator to oscillate at a different duty cycle. A comparator 34 has its input coupled via conductor 38 to the output of the oscillator 30 to detect a transition between the two modes at which it oscillates. An electronic power switch circuit 40 is energized by the comparator 34 to activate, in turn, the pump 14, by energizing its pump motor 14A. The comparator 34 generates an electrical signal for biasing the power switch 40 ON whenever the average direct current voltage output of the oscillator 30 is below a given level. Conversely, whenever the average direct current voltage output of the oscillator 30 is above the given level, the electronic power switch 40 is biased OFF.

As shown in FIG. 2, for the purpose of insulating electrically the oscillator 30, the comparator 34, and the electronic power switch 40 from the body of water 19 all three components are mounted on a printed circuit board 18 disposed in the housing 32 and encapsulated within a corrosion resistant encapsulating material, such as a suitable resin or epoxy material 33. Thus, the system 10 is very reliable as it contains no moving parts, and is not readily subject to corrosion from exposure to fluids, such as the water 19.

The capacitance sensing circuit 79 generally comprises a single conductive metal plate 67 fixed to an upright wall 32A of the housing 32 and extends in a direction transverse to the water level as shown in FIG. 2. As more fully described hereinafter in greater detail, the water body 19 cooperates with the plate 67 to provide a capacitor 78 (FIG. 1) for the oscillator 30. The resulting capacitance increases greatly as the water level rises. At the lower level 1, the value of the capacitance is relatively small. At the higher level 2, the value of capacitance is relatively large. Thus, the changes in the capacitance of the sensing circuit 79 cause changes in the duty cycle mode of oscillation of the oscillator 30.

Figure 3A:
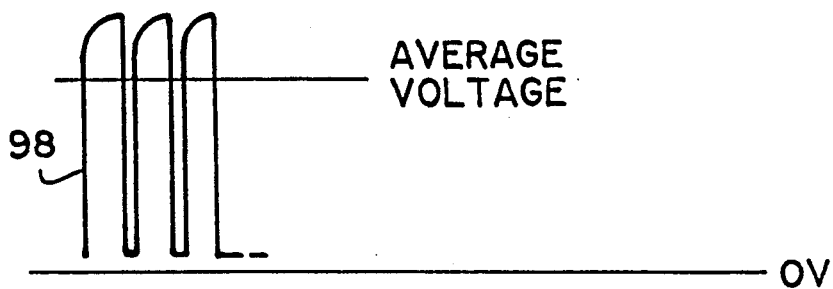
FIGS. 3A and 3B comprise a pair of graphs useful in understanding the operation of the system of FIG. 1.
Figure 3B:
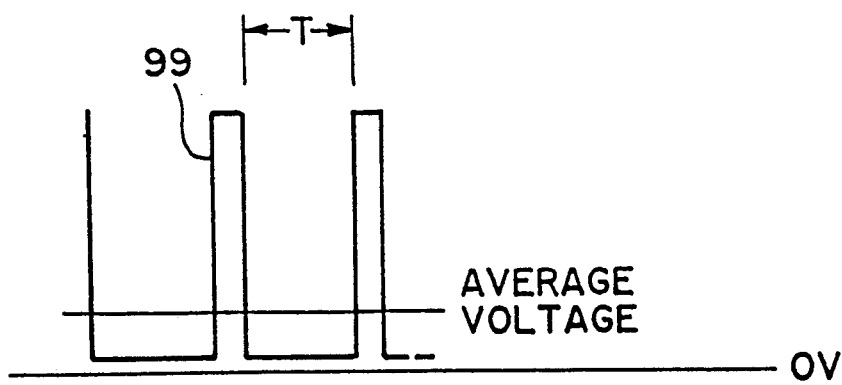

Considering now the oscillator 30 in greater detail with reference to FIGS. 1 and 3, the oscillator 30 generally comprises an operational amplifier 50 having an inverting input 52 and a non-inverting input 53 to enable it to oscillate at either a frequency as illustrated in FIG. 3A, or a waveform as illustrated in FIG. 3B. The duty cycle of the waveform signal 98 of FIG. 3A is relatively large and causes the pump motor to be deactivated. Alternatively, the longer duty cycle of the waveform signal 99 of FIG. 3B causes the components 34 and 40 to permit the pump motor 14A to be energized.

The non-inverting input 53 of the amplifier 50 is connected to a node 61A of a voltage divider network 61 to serve as a reference voltage. A 100K ohm positive feedback resistor 62 is connected between the output of the amplifier 50 and the node 61A for feedback purposes back to the input 53. A zener shunt regulator 44 coupled to the power source $V_{in}$ provides a constant operating voltage to the node 72, as well as other portions of the system 10, to compensate for voltage variations and provides a voltage of about 5.1 volts. The resistor 62 enables the oscillator 30 to function both as a phase shift oscillator and an RC oscillator relative to its two modes of operation, as will be explained hereinafter in greater detail.

The voltage divider network 61 includes a 1M ohm resistor 63 connected between the amplifier input 53 at node 61A, and the node 72 of the voltage regulator 44. A resistor 65 is connected between the input 53 via the node 61A and ground to provide a D.C. voltage division between the resistors 63 and 65 for the input 53.

The oscillator 30 also includes a feedback network 66 which is connected between the inverting input 52 and the output 51 of the amplifier 50. The input 52 is also connected to the plate 67 of the sensing circuit 79 via a lead 67A for facilitating the sensing of the level the body of water 19. The negative feedback network 66 includes a 100K ohm resistor 68 connected in parallel with a 10 pico farad capacitor 69, to enable the oscillator 50 to function as a phase shift oscillator, at a high average voltage, in its OFF mode of operation, as illustrated in FIG. 3A.

Considering now the capacitance sensing circuit 79, a potential difference is established between the plate 67 and the body of water 19 to produce an electrical charge of sufficient quantity to change significantly the operation of the oscillator 30. Since a larger surface area of the body of water 19 is disposed opposite the plate 67 at level 2 as compared to level 1, the change in the capacitance of the variable capacitor 78 is very significant through a relatively small incremental change in the water level.

Considering now the zener shunt regulator 44 in greater detail with reference to FIG. 1, the regulator 44 generally includes a grounded suitably-poled zener diode 70 connected to a common node 72 between a current limiting resistor 74 and pull up resistor 76, which, in turn, is connected to the output of the operational amplifier 50.

The current limiting resistor 74 is coupled between the D.C. power source $V_{in}$ (via the conductor 36) and the common node 72. The zener diode 70 helps regulate the direct current operational voltage for the amplifier 50 and the comparator 34. In this regard, the common node 72 is coupled to the amplifier 50 and the comparator 34, to provide a regulated voltage thereto.

Considering now the operation of the dual mode oscillator 30 with reference to the drawings, when the plate 67 sealed within its housing is immersed in the body of water 19 at or about level 1 (FIG. 2), the oscillator 30 functions in its OFF mode of operation as a phase shift oscillator as illustrated by the waveform 98 of FIG. 3A. When the body of water 19 rises to about level 2, the capacitance formed between the plate 67 and the adjacent water increases, thereby causing the oscillator 30 to function in its OFF mode of operation as an RC oscillator with a substantially shorter duty cycle, as illustrated in FIG. 3B by waveform 99.

The change in the capacitance of capacitor 78 is detected by the amplifier 50, which causes its output signal to be significantly changed as will be explained hereinafter. Although in the preferred form of the invention, the plate 67 is used as a proximity detector to detect the relative position of the level of water, it will be understood by those skilled in the art that a change in capacitance results when the plate 67 is brought into close proximity to any conductive media, whether solid, liquid, or gas.

Referring now to FIG. 2, assume the water 19 is disposed at level 1. The resistors 63 and 65 function as a voltage divider to establish the input voltage at the input 53 of the amplifier 50 at approximately one tenth of the regulated voltage at node 72, or about 0.5 volts. When the water is at level 1, the capacitance of capacitor 78 is negligible as compared to the capacitance of capacitor 69. Thus, the operating mode of the oscillator 30 is determined by the feedback signal from the output 51 of the amplifier 50 through the RC network, formed by the resistor 68 and the capacitor 69, to the input 52.

In this OFF mode of operation, the amplifier 50 functions as a phase shift oscillator, with the phase shift being attributable to the transient delay time of the amplifier 50. Thus, a quasi square wave signal 98 (FIG. 3A) with a substantially longer time period for its high voltage than the time period of its low voltage, is produced to provide an electrical output signal at 51. More particularly, when the voltage on the inverting input 52 is less than the reference voltage on input 53, the output voltage of the amplifier 50 is high.

However, when the voltage on the inverting input 52 is greater than the reference voltage at input 53, the output providing an A.C. voltage dividing effect. Thus, the voltage at the input 52 goes high rapidly, once the output voltage of the amplifier 50 goes high. With the input voltage at the input 52 high, the output voltage of amplifier 50 remains high for the phase delay time of the amplifier, to switch from its high output to its low output. As shown in FIG. 3A, this phase delay is illustrated graphically by the ascending curvilinear peaks.

When the amplifier 50 switches, its output rapidly switches to a low voltage level to permit the capacitor 69 to discharge. When the capacitor 69 discharges, the voltage at the input 52 becomes once again less than the reference voltage at the reference input 53 to cause the output voltage to rise rapidly above the average voltage level indicated in FIG. 3A thereby to repeat the oscillating operation cycle.

The oscillation frequency is determined by the impedance of the resistor 68 and the capacitor 69. In the OFF mode of operation, the output signal 98 of the oscillator 30 has an average direct current component of approximately 5 volts, as best seen in FIG. 3A.

Conversely, assume now that the body of water disposed substantially at level 2. The capacitance of capacitor 78 then becomes substantially larger than the capacitance of capacitor 69, so that its capacitance is negligible by comparison. In this regard, as shown in FIG. 3B, the ON mode of operation of the oscillator 30 is changed from a phase-shift oscillator to an RC oscillator, as established by the feedback input signal to the capacitor 78 through the resistor 68 as applied to the input 52, and as established by the offset input voltage at the input 53 through the feedback resistor 62. In this ON mode of operation, the oscillator 42 functions as an RC oscillator to produce another quasi square-wave signal 99 (FIG. 3B) which has a substantially longer cycle time period for its low voltage than the time period of its high voltage.

In the ON mode, when the output of amplifier 50 goes to a high voltage the capacitors 68 and 78 are charged to a high voltage to cause the voltage at the input 52 to be substantially greater than the reference voltage at the reference input 53. In this regard, when the input voltage at input 52 exceeds the reference voltage at input 53, the output of the amplifier 50 drops to a low voltage as indicated in FIG. 3B.

Once the output of amplifier 50 drops to the low voltage the charge on capacitor 78 is able to be discharged over a period of time. This period of time is determined by the RC network formed by the resistor 68 and the capacitor 78, as shown graphically in FIG. 3B, at, for example, a time T.

From the foregoing, it should be understood that, in the ON mode, the output voltage of the oscillator 30 is at a low voltage below a certain low average voltage level, for a period of time substantially longer than when the output voltage is at a high voltage level above the low average voltage level. Thus, in the ON mode, the duty cycle of the output signal 99 is substantially lower than the duty cycle of the signal 98 (FIG. 3A).

Considering now the comparator 34 in greater detail with reference to FIG. 1, the comparator 34 includes an operational amplifier 80 having an inverting input 56 and a noninverting input 55. The inverting input 56 is connected to the output of the amplifier 50 via a low pass filter 81. The low pass filter 81 cooperates with it to enable the amplifier 80 to produce an output voltage indicative of the direct current component of the output signal of the amplifier 50. In this regard, the filter 81 includes a 10 microfarad capacitor 81A and a 1M resistor 82. The capacitor 81A is coupled between ground and the input 56 of the amplifier 80. The resistor 82 is coupled between the output 51 of the amplifier 50 and the inverting input 56 of the amplifier 80.

In order to provide a smooth switching pulse as a result of the output of the oscillator 30 switching between its two frequency modes, the comparator 34 includes a feedback network, generally indicated at 83, which provides some hysteresis so that the comparator 34 has a deadband between modes and is not prone to indecision when switching. The feedback network 83 is coupled between a voltage divider circuit 84 connected to the non-inverting input 55 of amplifier 80 and the output 57 of the amplifier 80, and includes a suitably poled diode 85 and a series connected 6.2K ohm resistor 86. The diode is a 1N4148 diode, and is connected between the output 57 of the comparator 34 and through a current limiting resistor 86 to the voltage divider network 84, to establish a reference level voltage at the non-inverting input 55 of the comparator 34. The output of the amplifier 80 is coupled through a 10K ohm pull up resistor 87 to the power source $V_{in}$.

As best seen in FIG. 1, the voltage divider network 84 includes a 33K ohm resistor 88, which is connected between the non-inverting input 55 and the node 72 of the voltage regulator 44. A 47K ohm resistor 89 is connected between the input 55 and ground. The voltage divider network 84 cooperates with the voltage regulator 44 to provide about a two volt reference voltage at the input 55.

Considering now the operation of the comparator 34 in greater detail with reference to FIGS. 2, 3A and 3B, when the water level is at level 1, as shown in FIG. 2, the oscillator 30 has a high average direct current output signal 98 as shown in FIG. 3A, which signal is coupled to the inverting input 56 of the amplifier 80 through the low pass filter 81. In this regard, as the output voltage of the oscillator 30 has a high average voltage level, and is coupled to the inverting input of the amplifier 80, its output is switched to a low voltage level, since the inverting input voltage is greater than the non-inverting input reference voltage.

When the body of water 19 rises to level 2 (FIG. 2), the oscillator 30 has an output voltage signal 99 having a low average voltage as shown in FIG. 3B. In this ON mode, the inverting input voltage is less than the noninverting input voltage. Thus, the output of the comparator 34 is switched to a high voltage level. When the output of the comparator 34 is switched high, it causes the pump motor 14A of the pump 14 to be energized. Conversely, when the output of the comparator 34 is low, it causes the pump motor 14A to be de-energized.

Considering now the power switch 40 in greater detail with reference to FIG. 1, the power switch 40 includes a metal oxide semiconductor field effect transistor (MOSFET) 90. The transistor 90 an input terminal 91 which is coupled to the output 57 of the amplifier 80 via a conductor 94, to enable the comparator 34 to supply a bias voltage for transistor 90 for driving it into conduction during the ON mode of the oscillator 30. As best seen in FIG. 1, a conduction path is established between the power source $V_{in}$, at lead 36, through the motor 14A and the transistor 90 to ground, whenever the transistor 90 is biased ON by the positive output signal of the amplifier 80. Conversely, when the transistor 90 is biased OFF, the current path is opened, thus de-energizing the motor 14A. Diode 95 is connected in parallel with the motor 14A and serves, in well known fashion, to suppress voltage transients when the motor is turned ON and OFF.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A system, operating in proximity to a conductive medium, for controlling an electrical device, comprising:
   sensing means, having a variable capacitance, the capacitance of said sensing means having a very low capacitance value when in a first proximity to said conductive medium and changing to a substantially higher capacitance value when in a second proximity to said conductive medium; and
   a dual mode oscillator, having an output providing an output control signal to said electrical device and being responsive to a change in the capacitance value of said sensing means, for switching from a first mode of operation, as a phase shift oscillator having a first duty cycle, to a second mode of operation, as an RC oscillator having a second duty cycle, to thereby control the operation of said electrical device in accordance with said first and second duty cycles of said output control signal.

2. A system according to claim 1 further including encapsulating means for electrically insulating said dual mode oscillator and said sensing means from said conductive medium.

3. A system according to claim 1 further comprising comparator means, including switch means, responsive to said output control signal changing between said first and second duty cycles, for activating and de-activating said electrical device.

4. A system according to claim 3, wherein said comparator means includes a low pass filter for generating a time delay when said output control signal changes between said first and second duty cycles and extracting a DC component from said output control signal to cause said comparator means to effect the generation of a final control signal for activating and de-activating said electrical device according to said first and second duty cycles of said output control signal.

5. A system according to claim 1, wherein said dual mode oscillator includes an operational amplifier having an output terminal serving as the output of said dual mode oscillator, said operational amplifier having an inverting input, connected to said sensing means, and a noninverting input, connected to a source of reference potential, a first feedback resistor connected between the output terminal and the noninverting input of said operational amplifier and a second feedback resistor and a feedback capacitor connected in parallel between the inverting input and the output terminal of said operational amplifier, the value of said feedback capacitor being sufficiently larger than the capacitance value of said sensing means, when said sensing means is in either a one of said first proximity and said second proximity to said conductive medium, to enable said dual mode oscillator to function as a phase shift oscillator, and the capacitance value of said sensing means being much larger than the capacitance value of said feedback capacitor, when said sensing means is in the other proximity of said first proximity and said second proximity, to thereby render said feedback capacitor ineffective to thus enable said dual mode oscillator to function as an RC oscillator by feeding back, through said second feedback resistor, at least a portion of the output control signal from the output terminal to the inverting input of said operational amplifier.

6. A system operating in proximity to a conductive medium, for controlling the operation of an electrical load, comprising:
   (a) capacitive sensing means disposed in proximity with said conductive medium and possessing a capacitance which varies in accordance with the proximity of said conductive medium with respect to said sensing means;
   (b) a dual mode oscillator having an input connected to said sensing means, said oscillator being controlled, at the input thereof, by the capacitance of said sensing means and generating a pulsating signal having a first duty cycle when said sensing means is disposed in a first proximity relative to said conductive medium, and generating said pulsating signal at a second duty cycle when said sensing means id disposed in a second proximity relative to said conductive medium; and
   (c) means, connected between the output of said dual mode oscillator and said electrical load, for extracting a DC component from said pulsating signal during each of said first and second duty cycles and providing a DC control signal having a magnitude proportional to said DC component to said electrical load to control the operation thereof.

7. The system according to claim 6, further including means for electrically insulating said capacitive sensing means and said oscillator from said conductive medium.

8. The system according to claim 6, wherein the means for extracting said DC component and providing said DC control signal to said electrical load comprises a filter and comparator, responsive to the DC component in each of the first and second duty cycles of said pulsating signal, to thereby provide a final control signal to said electrical load which varies in magnitude according to the magnitude of the DC component in each of the first and second duty cycles of said pulsating signal.

9. The system according to claim 6, further including a feedback resistor and feedback capacitor connected in parallel from the output to the input of the oscillator.

10. A control system, adapted for disposition in the proximity of a conductive medium, for controlling the operation of an electrical load, comprising:
   (a) capacitor sensing means having a conductor encapsulated in a nonconductive material and being disposed in proximity with said conductive medium, said conductor serving as one plate of a capacitor and said conductive medium serving as the other plate of said capacitor, whereby said capacitor sensing means possesses a capacitance which varies in accordance with the proximity of said conductive medium with respect to said capacitive sensing means; and
   (b) a dual mode oscillator having an input connected to said conductor in said sensing means and an output, including means for transferring a control signal to said electrical load, said oscillator further including feedback means for feeding back at least a portion of said control signal from the output to the input thereof and being controlled, at the input thereof, in a first instance, by the portion of the control signal from said feedback means to effect the generation of said control signal at a first duty cycle, when said sensing means id disposed in a first proximity relative to said conductive medium, and being controlled, in a second instance, by the capacitance of said sensing means and a further portion of the control signal from said feedback means to effect a further generation of said control signal at a second duty cycle, when said sensing means is disposed in a second proximity relative to said conductive medium, to thereby control the operation of said electrical load according to the first and second duty cycles of said control signal.

11. A system for operating a motor driven pump to control the level of a conductive fluid in a vessel, comprising:
   (a) a capacitive sensor having a conductor encapsulated in a nonconductive material and being disposed in a prescribed proximity relative to said conductive fluid for sensing the level of said conductive fluid in said vessel, said conductor serving as one plate of a capacitor and said conductive fluid serving as the other plate of said capacitor, whereby the capacitance of said capacitive sensor varies in accordance with the level of said conductive fluid in the proximity of said capacitive sensor;
   (b) a dual mode oscillator having an input connected to said conductor in said capacitive sensor and being controllable by the capacitance thereof to operate in a first mode as a phase shift oscillator when said conductive fluid is at a first level and to operate in a second mode as an RC oscillator when said conductive fluid is at a second level, said oscillator generating a pulsed output signal having a first duty cycle when in said first mode and having a second duty cycle when in said second mode, said pulsed output signal possessing a first DC component associated with said first duty cycle and a second DC component associated with said second duty cycle;
   (c) a comparator for providing a control signal to said pump; and
   (d) a filter connected between the output of said oscillator and an input to said comparator, said filter extracting the DC component from said pulsed output signal during each of said first and second modes to provide a DC signal to said comparator to effect, at the output thereof, a control signal having a magnitude effective to turn said pump on and off according to the level of liquid in said vessel.

12. A system, operating in proximity to a conductive medium, for controlling the operation of an electrical load, comprising:
   (a) a capacitive sensor disposed in proximity with said conductive medium and possessing a capacitance which varies from a very low value to a substantially higher value in accordance with the proximity of said conductive medium with respect to said sensor;
   (b) a dual mode oscillator capable of operating in a first mode as a phase shift oscillator and operating in a second mode as an RC oscillator, said oscillator having an input connected to said sensor, and an output for generating a pulsating signal having a different duty cycle in each of said first and second modes, a feedback capacitor and a feedback resistor connected in parallel between the input and the output of said oscillator, said feedback capacitor normally providing a feedback signal to enable said oscillator to operate in said first mode, to generate a pulsating signal having a first duty cycle having a first DC component, when the capacitance of said sensor is significantly less than the capacitance of said feedback capacitor, said oscillator switching to said second mode to generate a pulsating signal having a second duty cycle having a second DC component when the capacitance of said sensor exceeds the capacitance of said feedback capacitor, such exceeding rendering said feedback capacitor substantially ineffective, to thus enable the feedback resistor to form an RC time constant in conjunction with the capacitance of said sensor to thereby switch said oscillator from said first mode to said second mode; and
   (c) means, connected to the output of said oscillator and responsive to the pulsating signal therefrom, for providing a control signal for controlling the operation of said electrical load in accordance with the DC component in each of said first and second duty cycles of said pulsating signal.

* * * * *